United States Patent
Nagase et al.

(10) Patent No.: US 7,633,166 B2
(45) Date of Patent: Dec. 15, 2009

(54) TERMINAL CONNECTION STRUCTURE FOR SEMICONDUCTOR DEVICE

(75) Inventors: Toshiaki Nagase, Aichi (JP); Hiroyuki Onishi, Aichi (JP); Jun Ishikawa, Aichi (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 434 days.

(21) Appl. No.: 11/414,643

(22) Filed: Apr. 27, 2006

(65) Prior Publication Data

US 2006/0255448 A1    Nov. 16, 2006

(30) Foreign Application Priority Data

May 10, 2005    (JP)    ............... 2005-137056

(51) Int. Cl.
*H01L 23/48*    (2006.01)
*H01L 23/52*    (2006.01)
*H01L 29/40*    (2006.01)

(52) U.S. Cl. ...................... 257/773; 257/784
(58) Field of Classification Search ................ 257/666, 257/784, 786, 735, 773
See application file for complete search history.

(56) References Cited

U.S. PATENT DOCUMENTS 5,212,405 A * 5/1993 Oigawa ....................... 257/672
5,250,839 A * 10/1993 Katoh et al. ................. 257/666
5,293,066 A * 3/1994 Tsumura ..................... 257/668
6,329,714 B1 * 12/2001 Guillot ....................... 257/723

FOREIGN PATENT DOCUMENTS

JP        06-069415        3/1994

* cited by examiner

*Primary Examiner*—S. V Clark
(74) *Attorney, Agent, or Firm*—Locke Lord Bissell & Liddell LLP

(57) ABSTRACT

A first wiring member and a second wiring member, through which currents flow in directions opposite to each other, each have a flat plate shape and are arranged to be adjacent and opposed to each other, to thereby reduce inductances of the first wiring member and the second wiring member due to an effect of a mutual inductance. A joint of the first wiring member and a joint of the second wiring member are joined to the positive terminal and the negative terminal of the semiconductor device through ultrasonic bonding, respectively. As a result, the joint of the first wiring member and the joint of the second wiring member are not required to be provided with exclusive portions for screw mounting unlike a conventional manner, so each of the joints can have a small area, to thereby making it possible to reduce inductances of the first wiring member and the second wiring member.

3 Claims, 3 Drawing Sheets

TERMINAL CONNECTION STRUCTURE FOR SEMICONDUCTOR DEVICE

BACKGROUND OF THE INVENTION

1. Field of the Invention

The present invention relates to a terminal connection structure for a semiconductor device, and more particularly to a structure for connecting a pair of electrode terminals of an external device, in which currents flow in directions opposite to each other, with corresponding electrode terminals of the semiconductor device, respectively.

2. Description of the Related Art

For example, JP 06-69415 A discloses a semiconductor device used as a power module or the like for constituting an inverter device. In the semiconductor device, a pair of internal wiring units which are held in a case and in which currents flow in directions opposite to each other are arranged to be adjacent and opposed to each other. Due to an effect of a mutual inductance, an inductance of each of the internal wiring units is reduced.

In addition, in the semiconductor device, a positive terminal and a negative terminal connected to the pair of internal wiring units, respectively, are drawn out to the outside of the case to be disposed on a top surface of the case. A hole for screw mounting is provided in each of the positive terminal and the negative terminal of the semiconductor device. Such a semiconductor device has a pair of wiring members connected to a positive terminal and a negative terminal of an external device, respectively. A hole for screw mounting is also provided in each of the pair of wiring members. The pair of wiring members are secured by screws to the corresponding electrode terminals of the semiconductor device. As a result, it is possible to electrically connect the positive terminal and the negative terminal of the semiconductor device with the positive terminal and the negative terminal of the external device, respectively, through the pair of wiring members.

However, exclusive portions for screw mounting in which holes for screw mounting are formed must be provided in the pair of wiring members, respectively. In addition, since the exclusive portions for screw mounting necessary of the pair of wiring members are secured by screw to the positive terminal and the negative terminal arranged on the top surface of the case of the semiconductor device, it is impossible to arrange the pair of wiring members to be adjacent and opposed to each other as in the internal wiring units disclosed in JP 06-69415 A. As a result, there has been a problem in that an inductance of the wiring members becomes large. Therefore, when switching is performed by the semiconductor device, for example, a large surge voltage may be generated due to the large inductance of the wiring members. When the surge voltage exceeds a withstanding voltage of the semiconductor device, an accident such as breakage of a semiconductor element in the semiconductor device may occur.

SUMMARY OF THE INVENTION

The present invention has been made in order to solve the above-mentioned problems, and an object of the present invention is to provide a terminal connection structure for a semiconductor device capable of reducing an inductance of wiring members.

According to the present invention, there is provided a terminal connection structure for a semiconductor device, including: a pair of electrode terminals of an external device; a pair of electrode terminals of the semiconductor device each corresponding to the pair of electrode terminals of the external device, respectively; and a pair of wiring members each having a flat plate shape and arranged to be adjacent and opposed to each other for connecting the pair of electrode terminals of the external device with the corresponding pair of electrode terminals of the semiconductor device, respectively, and in which currents flow in directions opposite to each other, the pair of wiring members and the pair of electrode terminals of the semiconductor device being joined through ultrasonic bonding, respectively.

DETAILED DESCRIPTION OF THE PREFERRED EMBODIMENTS

Hereinafter, embodiments of the present invention will be described with reference to the accompanying drawings.

First Embodiment

Figure 1:
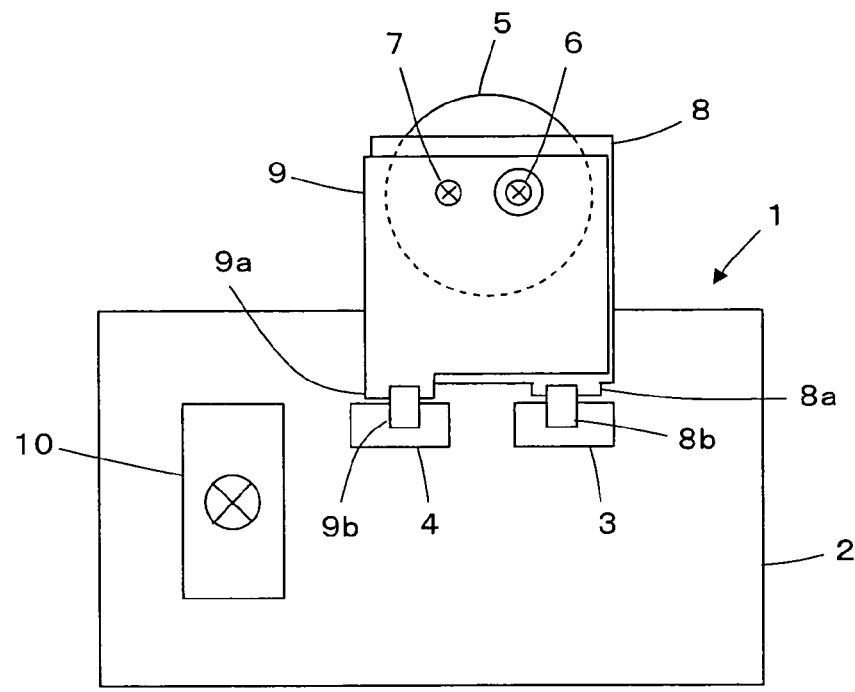
FIG. 1 is a plan view showing a terminal connection structure for a semiconductor device according to a first embodiment of the present invention.

FIG. 1 shows a terminal connection structure for a semiconductor device according to a first embodiment of the present invention. A semiconductor device 1 is used as a power module for constituting an inverter device and includes a case 2 formed of a resin or the like. A semiconductor circuit (not shown) is provided inside the case 2, and a positive terminal 3 and a negative terminal 4 connected to the semiconductor circuit and drawn out to the outside of the case 2 are arranged on a top surface of the case 2, respectively.

In addition, a power capacitor 5 serving as an external device is arranged in the vicinity of the semiconductor device 1. A positive terminal 6 of the power capacitor 5 is electrically connected to the positive terminal 3 of the semiconductor device 1 through a first wiring member 8. A negative terminal 7 of the power capacitor 5 is electrically connected to the negative terminal 4 of the semiconductor device 1 through a second wiring member 9. In this case, the first wiring member 8 and the second wiring member 9 each have a substantially rectangular flat plate shape, and are arranged to be adjacent and opposed to each other. The positive terminal 6 of the power capacitor 5 is connected to one end of the first wiring member 8, and the negative terminal 7 of the power capacitor 5 is connected to one end of the second wiring member 9. At the other ends of the first wiring member 8 and the second wiring member 9, there are provided joints 8a and 9a, respectively. The joints 8a and 9a each have a small area and are arranged so as not to overlap each other. The joint 8a of the first wiring member 8 and the joint 9a of the second wiring member 9 are joined to the positive terminal 3 and the negative terminal 4 of the semiconductor device 1, respectively, through ribbon bonding, which is a kind of ultrasonic bonding.

Note that, on the top surface of the case 2 of the semiconductor device 1, a midpoint electrode terminal 10 is also arranged which is connected to the semiconductor circuit (not shown) in the case 2 and is drawn out to the outside of the case 2.

Figure 2:
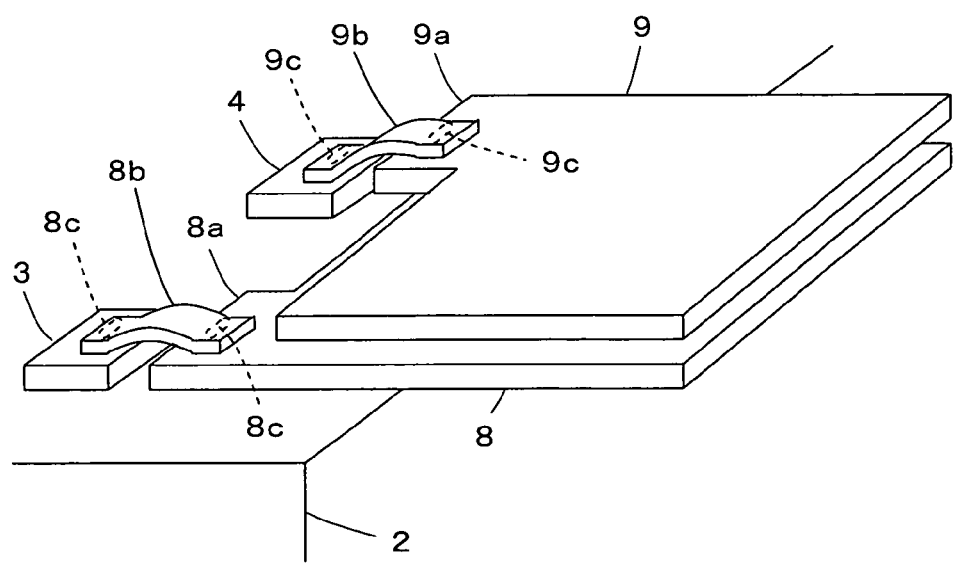
FIG. 2 is a perspective view showing a structure in the vicinity of terminals of the semiconductor device in the first embodiment of the present invention.

As shown in FIG. 2, the positive terminal 3 of the semiconductor device 1 is joined to a joint portion 8c of the ribbon member 8b at one end thereof, while the joint 8a of the first wiring member 8 is joined to another joint portion 8c of the ribbon member 8b at the other end thereof. With such a structure, the positive terminal 3 of the semiconductor device 1 and the first wiring member 8 are electrically connected through the ribbon member 8b. That is, it can be said that the positive terminal 3 of the semiconductor device 1 and the first wiring member 8 are joined to each other through the ribbon member 8b. Further, the negative terminal 4 of the semiconductor device 1 is joined to a joint portion 9c of the ribbon member 9b at one end thereof, while the joint 9a of the second wiring member 9 is joined to another joint portion 9c of the ribbon member 9b at the other end thereof. With such a structure, the negative terminal 4 of the semiconductor device 1 and the second wiring member 9 are electrically connected through the ribbon member 9b. That is, it can be said that the negative terminal 4 of the semiconductor device 1 and the second wiring member 9 are joined to each other through the ribbon member 9b.

Static pressure in a vertical direction is applied to the ribbon member 8b against the joint 8a of the first wiring member 8 and the positive terminal 3 of the semiconductor device 1, and oscillation is applied thereto by an ultrasonic wave oscillator, thereby causing them fictional motions to join them to each other. In a similar manner, static pressure in a vertical direction is applied to the ribbon member 9b against the joint 9a of the second wiring member 9 and the negative terminal 4 of the semiconductor device 1, and oscillation is applied thereto by the ultrasonic wave oscillator, thereby causing them fictional motions to join them to each other.

Figure 3:
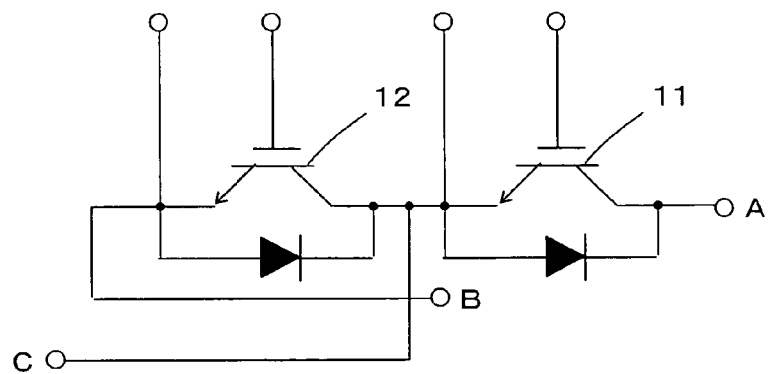
FIG. 3 is a circuit diagram showing a structure of inside of a case in the first embodiment of the present invention.

Now, as shown in FIG. 3, inside the case 2 of the semiconductor device 1, there are two main circuit elements 11 and 12 for constituting an upper arm and a lower arm for one phase. The main circuit elements 11 and 12 are connected in series with each other. In this circuit, the positive terminal 3 of the semiconductor device 1 is drawn out from a point A, and the negative terminal 4 of the semiconductor device 1 is drawn out from a point B. Note that the midpoint electrode terminal 10 of the semiconductor device 1 is drawn out from a point C. By using three such semiconductor devices 1, a three-phase inverter main circuit can be formed.

Next, an effect of the terminal connection structure for a semiconductor device according to the first embodiment of the present invention will be described. When switching operation is performed on the main circuit element 11 of the upper arm and the main circuit element 12 of the lower arm, currents flow in directions opposite to each other through the first wiring member 8 connecting the positive terminal 6 of the power capacitor 5 to the positive terminal 3 of the semiconductor device 1 and the second wiring member 9 connecting the negative terminal 7 of the power capacitor 5 to the negative terminal 4 of the semiconductor device 1. Since the first wiring member 8 and the second wiring member 9, through which thus currents flow in directions opposite to each other, each have a flat plate shape and are arranged so as to be adjacent and opposed to each other, due to an effect of a mutual inductance, an inductance of each of the first wiring member 8 and the second wiring member 9 can be reduced.

The joint 8a of the first wiring member 8 and the joint 9a of the second wiring member 9 are joined to the positive terminal 3 and the negative terminal 4 of the semiconductor device 1, respectively, through ultrasonic bonding. Therefore, the joint 8a of the first wiring member 8 and the joint 9a of the second wiring member 9 are not required to be provided with exclusive portions for screw mounting unlike a conventional manner, so each of the joints 8a and 9a needs no large area. As a result, the inductance of each of the first wiring member 8 and the second wiring member 9 can be further reduced.

Accordingly, it is possible to avoid the occurrence of an accident such as a breakage of the semiconductor element in the semiconductor device 1 by surge voltage due to the inductances of the first wiring member 8 and the second wiring member 9 at the time of switching by the semiconductor device 1, for example. In addition, a value of the surge voltage can be limited to be small, thereby making it possible to use semiconductor element or the like having a small withstanding voltage in the device 1. Therefore, manufacturing cost can be lowered.

Further, each of the positive terminal 3 and the negative terminal 4 of the semiconductor device 1 can also be formed by a member having a smaller area than that in a case of screw mounting. Therefore, it is possible to realize miniaturization of the semiconductor device 1 and reduction in manufacturing cost.

Second Embodiment

Next, with reference to FIG. 4, a terminal connection structure for a semiconductor device according to a second embodiment of the present invention will be described. The second embodiment is different from the above-mentioned first embodiment in that the joint 8a of the first wiring member 8 and the joint 9a of the second wiring member 9 are joined to a positive terminal 21 and a negative terminal 22 of the semiconductor device 1, respectively, through resistance welding instead of ultrasonic bonding.

In this case, the positive terminal 21 and the negative terminal 22 of the semiconductor device 1 each have a shape protruding upwardly from the top surface of the case 2. The joint 8a of the first wiring member 8 and the joint 9a of the second wiring member 9 are bent upwardly to be opposed to the positive terminal 21 and the negative terminal 22, respectively.

With the joint 8a of the first wiring member 8 and the joint 9a of the second wiring member 9 being in contact with the positive terminal 21 and the negative terminal 22 of the semiconductor device 1, respectively, currents are caused to flow through these contact portions to melt by utilizing heat generation due to an electrical resistance at the contact portions. At this time, the contact portions are pressurized against each other so that the joint 8a of the first wiring member 8 and the joint 9a of the second wiring member 9 are joined to the positive terminal 21 and the negative terminal 22 of the semiconductor device 1 through joint portions 8c and 9c, respectively.

Even when joining is performed through resistance welding, the first wiring member 8 and the second wiring member 9 are adjacent and opposed to each other, and the joint 8a of the first wiring member 8 and the joint 9a of the second wiring member 9 are not required to be provided with exclusive portions for screw mounting, so the joints 8a and 9a each can have a small area as in the case of the first embodiment. As a result, inductances of the first wiring member 8 and the second wiring member 9 can be reduced, to thereby making it possible to obtain the same effect as that in the first embodiment.

Figure 4:
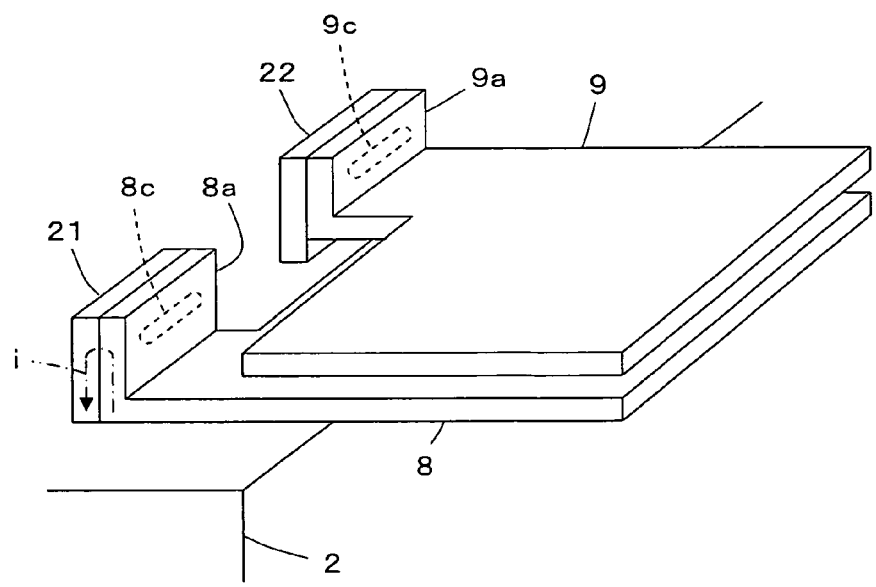
FIGS. 4 and 5 are perspective views showing structures in the vicinity of the terminals of the semiconductor device in a second embodiment and a third embodiment of the present invention, respectively.

In addition, in the second embodiment, in the vicinity of the joint portion 8c between the joint 8a of the first wiring member 8 and the positive terminal 21 of the semiconductor device 1 which are opposed to each other, a current i flows through the joint 8a of the first wiring member 8 in a direction opposite to a current flowing through the positive terminal 21 of the semiconductor device 1, as indicated by a dash-dotted line shown in FIG. 4. In a similar manner, also in the vicinity of the joint 9c between the joint 9a of the second wiring member 9 and the negative terminal 22 of the semiconductor device 1 which are opposed to each other, a current i flows through the joint 9a of the second wiring member 9 in a direction opposite to a current flowing through the negative terminal 22 of the semiconductor device 1. Consequently, inductances of those parts can also be reduced.

Note that joining between the joint 8a of the first wiring member 8 and the positive terminal 21 of the semiconductor device 1, and joining between the joint 9a of the second wiring member 9 and the negative terminal 22 of the semiconductor device 1 can also be performed directly through ultrasonic bonding instead of resistance welding.

Third Embodiment

Figure 5:
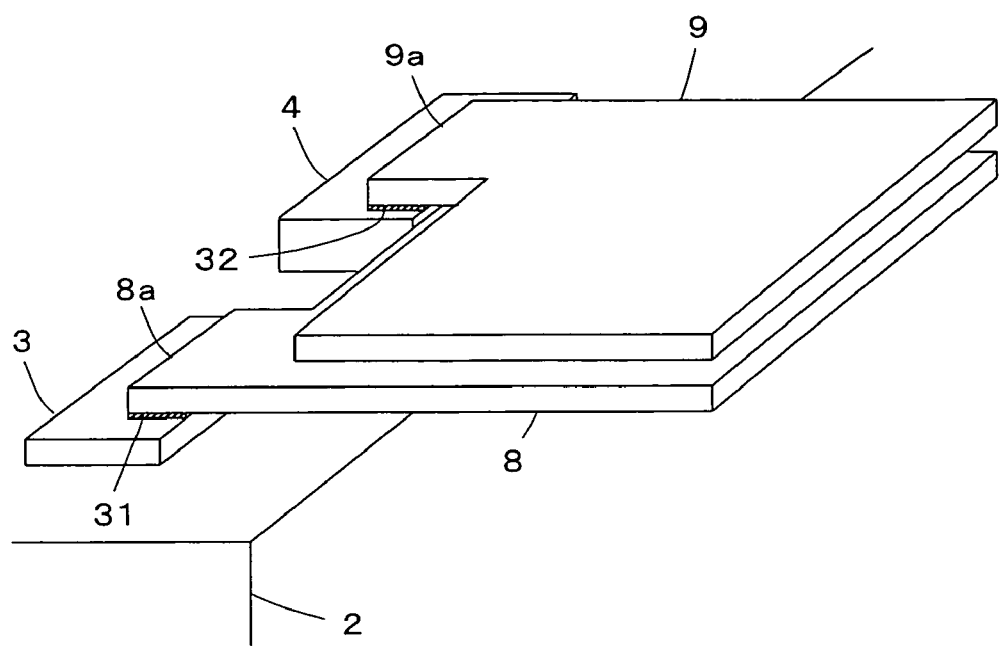

Next, with reference to FIG. 5, a terminal connection structure for a semiconductor device according to a third embodiment of the present invention will be described. In the third embodiment, through soldering instead of ultrasonic bonding employed in the above-mentioned first embodiment, the joint 8a of the first wiring member 8 is joined to the positive terminal 3 of the semiconductor device 1, and the joint 9a of the second wiring member 9 is joined to the negative terminal 4 of the semiconductor device 1.

In this case, the joint 8a of the first wiring member 8 and the positive terminal 3 of the semiconductor device 1 are joined to each other through solder 31, and the joint 9a of the second wiring member 9 and the negative terminal 4 of the semiconductor device 1 are joined to each other through solder 32.

Even when joining is performed through soldering, the first wiring member 8 and the second wiring member 9 are adjacent and opposed to each other, and the joint 8a of the first wiring member 8 and the joint 9a of the second wiring member 9 are not required to be provided with exclusive portions for screw mounting, so the joints 8a and 9a each can have a small area as in the case of the first embodiment. As a result, inductances of the first wiring member 8 and the second wiring member 9 can be reduced, to thereby making it possible to obtain the same effect as that in the first embodiment.

Further, even with a structure as shown in FIG. 4, in which the positive terminal 21 and the negative terminal 22 of the semiconductor device 1 each protrude upwardly from the top surface of the case 2, and in which the joint 8a of the first wiring member 8 and the joint 9a of the second wiring member 9 are bent upwardly to be opposed to the positive terminal 21 and the negative terminal 22, respectively, joining between the joint 8a of the first wiring member 8 and the positive terminal 21 of the semiconductor device 1, and joining between the joint 9a of the second wiring member 9 and the negative terminal 22 of the semiconductor device 1 can also be performed through soldering.

Note that in the above-mentioned first to third embodiments, instead of the circuit for constituting one phase of the inverter main circuit, a chopper circuit or the like may be accommodated in the case 2 of the semiconductor device 1.

In addition, the joining method is not limited to ultrasonic bonding, resistance welding, and solder joint. By using various kinds of joining methods with which joining can be performed without a mechanical joining, the joint 8a of the first wiring member 8 and the joint 9a of the second wiring member 9 may be joined to the positive terminal 3 and the negative terminal 4 of the semiconductor device 1, respectively.

As the power capacitor 5, an electrolytic capacitor or other various kinds of capacitors can be used.

Further, the external device is not limited to the power capacitor 5. Any other kinds of devices such as DC power line can be connected as an external device as long as a device has a structure in which there are provided a pair of electrode terminals each connected to the corresponding electrode terminals of the semiconductor device through the first wiring member 8 and the second wiring member 9, respectively, and in which currents flow in directions opposite to each other through the first wiring member 8 and the second wiring member 9.

What is claimed is:

1. A terminal connection structure for a semiconductor device, comprising:
   a pair of electrode terminals of an external device;
   a pair of electrode terminals of the semiconductor device corresponding to the pair of electrode terminals of the external device, respectively; and
   a pair of wiring members, each having a flat plate-shaped portion which is arranged to be adjacent and overlapped with each other, wherein the wiring members connect the pair of electrode terminals of the external device with the corresponding pair of electrode terminals of the semiconductor device, respectively, and in which current flows in directions opposite to each other, such that (i) a first end of the first flat plate-shaped portion is connected to the first electrode terminal of the external device and a first end of the second flat plate-shaped portion, which is adjacent and overlapped with the first end of the first plate-shaped portion, is connected to the second electrode terminal of the external device, and (ii) at a second end of the first flat plate-shaped portion, which is opposite to the first end, a connector joint is formed unitary with the first flat plate-shaped portion and the connector joint of the first flat plate-shaped portion is connected to the first electrode terminal of the semiconductor device, and at a second end of the second plate-shaped portion, which is opposite to the first end, a connector joint is formed unitary with second flat-shaped portion and the connector joint of the second flat plate-shaped portion is connected to the second electrode terminal of the semiconductor device, wherein the connector joint of the first flat plate-shaped portion is not overlapped with the connector joint of the second flat plate-shaped portion,
   the connector joints of the pair of wiring members and the pair of electrode terminals of the semiconductor device being connected through ultrasonic bonding, respectively,
   wherein a positive terminal and a negative terminal of a power capacitor are used as the pair of electrode terminals of the external device each comprise, respectively,
   the semiconductor device comprises a semiconductor circuit for constituting one phase of an inverter main circuit with a three-phase structure, and
   the pair of electrode terminals of the semiconductor device being a positive terminal and a negative terminal which are connected to the semiconductor circuit, respectively.

2. A terminal connection structure for a semiconductor device according to claim 1, wherein the pair of wiring members and the pair of the electrode terminals of the semiconductor device are joined to each other through ribbon bonding.

3. A terminal connection structure for a semiconductor device according to claim 1, wherein the pair of wiring members and the pair of electrode terminals of the semiconductor device are directly joined to each other.

* * * * *